United States Patent [19]

Suzuki

[11] 3,947,829
[45] Mar. 30, 1976

[54] LOGICAL CIRCUIT APPARATUS
[75] Inventor: Yasoji Suzuki, Kanagawa, Japan
[73] Assignee: Tokyo Shibaura Electric Co., Ltd., Japan
[22] Filed: July 22, 1974
[21] Appl. No.: 491,477

[30] Foreign Application Priority Data
July 24, 1973 Japan.............................. 48-83302

[52] U.S. Cl........................ 340/173.5 P; 340/172.5
[51] Int. Cl.².......................................... G11C 17/00
[58] Field of Search...................... 340/173 R, 172.5

[56] References Cited
UNITED STATES PATENTS
3,763,480  10/1973  Weimer........................... 340/173 R Primary Examiner—Terrell W. Fears
Attorney, Agent, or Firm—Cushman, Darby & Cushman

[57] ABSTRACT

A plurality of logical control circuits each having a storage or delay function are driven by a writing-in clock pulse $\phi 1$ and a reading-out clock pulse $\phi 2$ supplied in common thereto and receiving output signals from a Read Only Memory constructed in the form of a matrix. This Read Only Memory is constituted by a plurality of logical gate circuits each supplied with a plurality of prescribed signals of a pulse signal group having a plurality of input signals I1, I2, . . . In and control pulse signals T8, D4, A and B different in frequency from the clock pulses $\phi 1$ and $\phi 2$. The logical control circuit includes a first logical gate supplied with a feed back signal from the logical control circuit and a prescribed control pulse signal and a second logical gate supplied with an output signal generated from the corresponding logical gate circuit of the Read Only Memory in accordance with the prescribed control pulse signal and prescribed input signals and with an output signal from the first logical gate the output of the second logical gate is delayed in response to clock pulses $\phi 1$ and $\phi 2$ and then is generated as an output signal from the logical control circuit.

7 Claims, 12 Drawing Figures

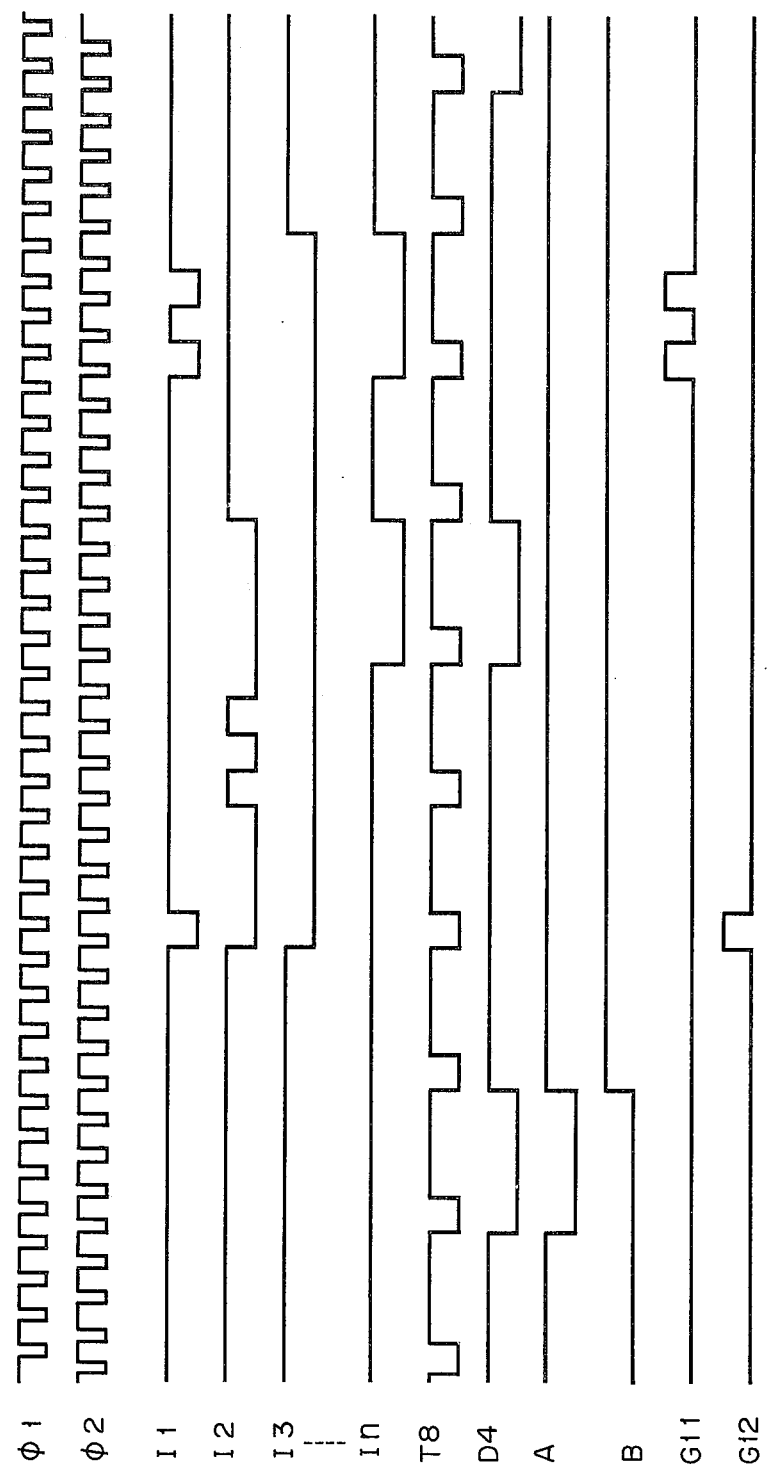

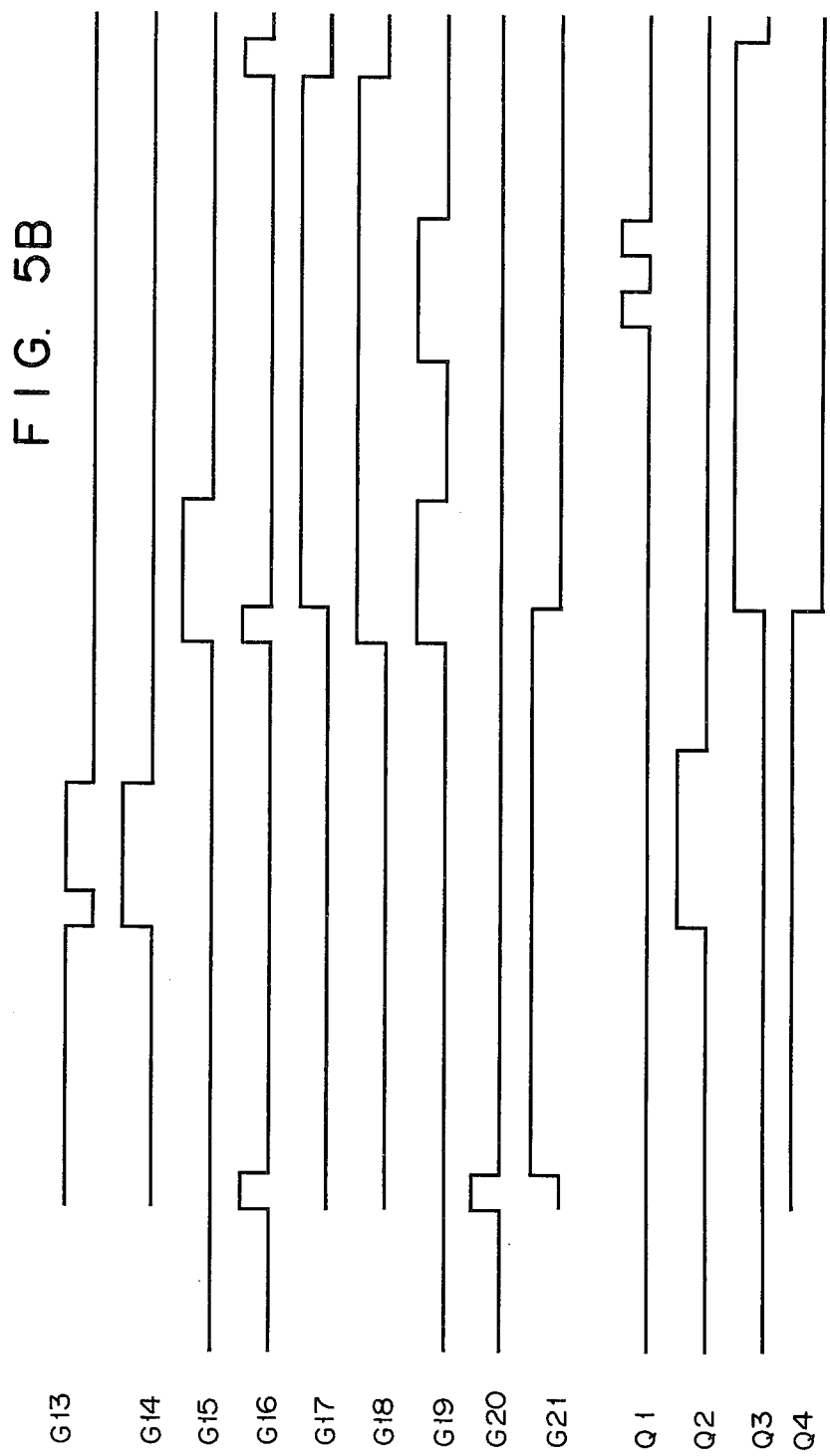

LOGICAL CIRCUIT APPARATUS

This invention relates to a logical circuit apparatus suitable for conversion into an integrated circuit, and more particularly to a integrated logical circuit apparatus including delay circuits such as shift registers or storage circuits such as flip-flop circuits and constituted by insulated gate field effect transistors (hereinafter referred to as "FET").

Recently, a prominent improvement in the technique of integrated circuit has enabled a considerable miniaturization of elements used in a large scale integrated circuit (LSI) or a middle scale integrated circuit (MSI). As a result, a larger number of circuits having a desired function have been able to be formed on a semiconductor element chip having a fixed area, and a large-sized semiconductor wafer has been able to be manufactured with high yields, enabling the formation of an LSI wherein several thousands of elements can be formed on one chip. Under these circumstances, improvement in the circuit construction and circuit pattern is being made in order that a larger number of circuits having a desired function can be constructed within a smaller area.

A logical circuit apparatus used as an operation address control circuit for use in the conventional electronic desktop calculator and used in an electronic clock apparatus is constructed as shown in FIG. 1. Referring to FIG. 1, logical gates G1 to G3 each having inputs I1, I2 . . . In are respectively connected to delay circuits such as shift registers SR1 to SR3, and logical gates G4 and G5 are respectively connected via inverters to a storage circuit such as a flip-flop circuit FF. The shift registers and flipflop circuit are driven by four different clock pulses $\phi1$, $\phi2$, $\phi3$ and $\phi4$. The logical gate G and delay circuit SR are constructed as shown in FIG. 2A, and the delay circuit is provided with a stable feedback circuit SF. This stable feedback circuit is provided in order that where the delay circuit is operated by the clock pulse $\phi3$ having a larger length of cycle than the clock pulses $\phi1$ and $\phi2$, it can be operated stably. The delay circuit having such stable feedback circuit SF requires fourteen circuit elements as apparent from FIGS. 2A and 2B, and when the six elements required to form such a circuit as shown in FIG. 2B for generating the clock pulse $\phi3$ are added to the number of elements for use in the delay circuit, twenty circuit elements are required in all, which results in the drawback that the number of circuit elements is increased.

When the logical gates G1 to G3 and shift registers SR1 to SR3 of the logical circuit apparatus shown in FIG. 1 are integrated, this logical circuit is constructed into such a pattern as shown in FIG. 3. As previously mentioned, since the four clock pulses $\phi1$ to $\phi4$ are utilized, fourteen clock pulse lines are required and yet an area in which gate circuits for forming the clock pulses $\phi3$ and $\phi4$ are to be formed is required with the result that such conventional logical circuit construction as shown in FIG. 1 undesirably causes the enlargement of an area required for circuit formation as apparent from FIG. 3.

The object of the invention is to provide a logical circuit apparatus wherein a plurality of logical control circuits each having a delay or storage function can be operated with a reduced number of clock pulses thereby having a reduced pattern area.

According to the invention, a plurality of logical control circuits each having a desired logical function are driven by the clock pulses $\phi1$ and $\phi2$ supplied in common thereto and a plurality of logical gates are each supplied with a plurality of prescribed signals of a pulse signal group including a plurality of clock signals having a frequency different from that of said clock pulses $\phi1$ and $\phi2$ and a plurality of input signals. The output of each logical gate is supplied to the corresponding logical control circuit, and is subjected there to a logical control, for example, delay or storage control by the output of a logical gate supplied with clock signals and a feedback signal from the output terminal of the logical control circuit.

This invention can be more fully understood from the following detailed description when taken in conjunction with the accompanying drawings, in which:

FIGS. 5A and 5B are time charts of signals generated from respective parts of FIG. 4;

Figure 4:
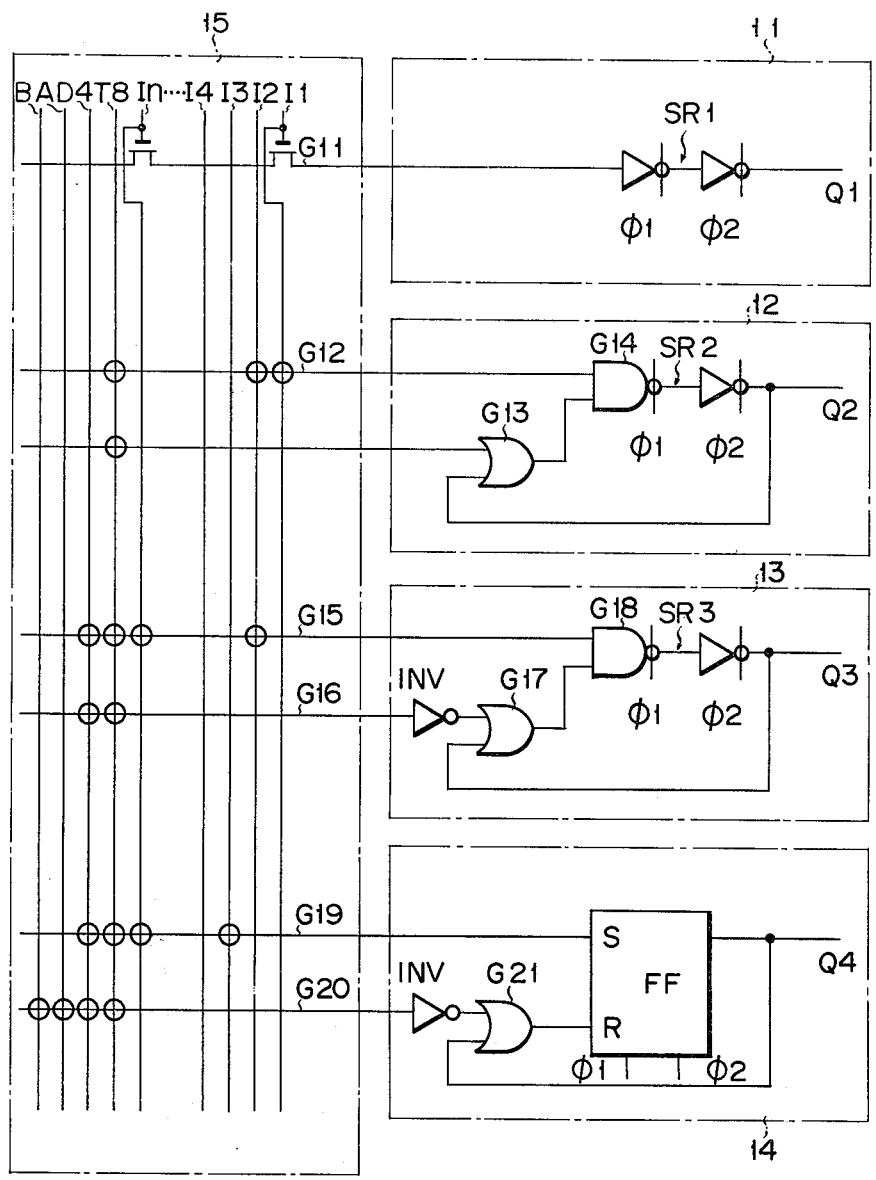
FIG. 4 shows a logical circuit apparatus according to an embodiment of the invention.

As shown in FIG. 4, a logical gate circuit 15 is constituted by a Read Only Memory (hereinafter abbreviated to "ROM") supplied with a plurality of input signals I1, I2, I3, I4 . . . In and control pulse signals In, I8, D4, A and B. In FIG. 4, a mark o indicates the same FET as shown in G11. Logical gate circuit 11 is constituted by a plurality of logical gates, for example, by NAND gates G11, G12, G15, G16, G19 and G20. These gates are each constituted by MOS FET's respectively driven by prescribed signals of a signal group having input signals I1, I2 . . . In and control pulse signals T8, D4, A and B. The output of logial gate circuit G11 is supplied to a logical control circuit 11, for example, a delay circuit, i.e., shift register SR1. The output of the logical gate G12 is supplied to a logical control circuit 12, which is constituted by an OR gate G13 supplied with the control pulse signal T8 and a feedback signal from the output terminal of the control circuit 13, an AND gate G14 connected to the respective output terminals of OR gate G13 and logical gate G12, and a delay circuit, i.e., shift register SR2 connected to the output of AND gate G14. The output of the logical gate G15 is supplied to a logical control circuit 13, which is constituted by an inverter INV for inverting the output of the logical gate G16 corresponding to a logical product of the control pulse signals T8 and D4, and OR gate G17 supplied with an output from inverter INV and a feedback signal from the output terminal of the control circuit 13, an AND gate G18 supplied with an output from OR gate G17 and an output from the logical gate, and a shift register SR3 for shifting the output of AND gate G18. The output of the logical gate G19 is supplied to the set terminal S of a storage circuit, e.g., flip-flop circuit FF included in a logical control circuit 14, and the output of the logical gate G20 is supplied to one input terminal of an OR gate G21 via an inverter INV. OR gate G21 has the other input terminal supplied with a feedback signal from the output teminal Q4 of the flip-flop circuit FF and an output terminal connected to the reset terminal R of the flip-flop circuit FF. The shift registers SR1, SR2, SR3 and the flip-flop circuit respectively included in the logical control circuits 11 to 14 are supplied in common with a writing-in clock pulse $\phi 1$ and a readingout clock pusle $\phi 2$.

The operation of the aforesaid logical circuit apparatus will now be described by reference to time charts shown in FIGS. 5A and 5B.

An output signal corresponding to a logical product of the input signals, for example, I1 and In is generated from the logical gate G11, and is shifted by the shift register SR1 driven by the clock pulses $\phi 1$ and $\phi 2$, and an output signal Q1 is generated from the logical control circuit 12. From the logical gate G12 is generated an output signal corresponding to a logical product of the input signals, for example, I1 and I2 and the control pulse signal, for example, T8. The AND gate G14 generates an output corresponding to a logical product of the output signal of the gate G12 and the output signal of the OR gate G13 corresponding to a logical sum of the control pulse signal T8 and a feedback signal from the shift register SR2. The output of this gate G18 is shifted by the shift register SR2 and then is generated as an output signal Q2 from the logical control circuit 12. It is to be noted here that in this circuit 13 the shift register SR2 is subjected to a writing-in control by a signal corresponding to a logical product of the control pulse T8 and the clock pulse $\phi 1$ and, since this logical product signal has the same waveform as that of a clock pulse $\phi 3$ used in the prior art apparatus, performs the same operation as in the case driven by the clock pulse $\phi 3$. The logical gate G15 generates an output signal based on a logical product of the input signals, for example, I1 and In and the control pulse signals, for example, T8 and D4. From the logical gate G16 is generated a signal corresponding to a logical product of the control pulse signals, for example, T8 and D4. The logical gate G18 generates a signal based on a logical product of the gates G15 and G17, and an output signal Q3 is generated from the shift register SR3 in response to the output of said gate G18. As in the foregoing circuit 13, in the logical control circuit 14 the shift register SR3 is subjected to a writingin control by a signal corresponding to a logical product of the control pulse signals D4, T8 and $\phi 1$ and, since this logical product signal corresponds to a clock pulse $\phi 4$, generates the same output as in the case driven by the clock pulse $\phi 4$.

The logical gate G19 generates a signal based on a logical product of the input signals, I3 and In and the control pulse signals, for example, T8 and D4 to control the setting operation of the flip-flop circuit. The logical gate G20 generates a signal based on a logical product of the control pulse signals, for example, T8, D4, A and B. This output signal is inverted by the inverter INV, and this inverted output and a feedback signal from the flip-flop circuit FF are supplied to the OR gate G21. By the output of OR gate G21, the resetting operation of the flip-flop circuit FF is controlled. That is, when the output of the logical gate G19 has a logical level of "1", the flip-flop circuit is set to cause an output Q4 to become 1 whereas when the output of the OR gate G21 has a logical level of 1 , the flip-flop circuit is reset to cause the output Q4 to become "0". In the foregoing description, the logical gates G11, G12, G15 and G19 are supplied with the input signals I, In; I1, I2; I2, In and I3, In, respectively. This definition, however, is given for convenience of explanation. Actually, a plurality of prescribed signals of the input signals I1 to In are supplied as inputs to each of said logical gates. Further, in the foregoing description, the T8 and D4 only are given as the control signals. Actually, however, these control signals include, for example, bit signals T1, T2, T4 and T8 and digit signals, for example, D1 to D12 corresponding to the digit positions of the electronic desktop calculator.

Figure 6:
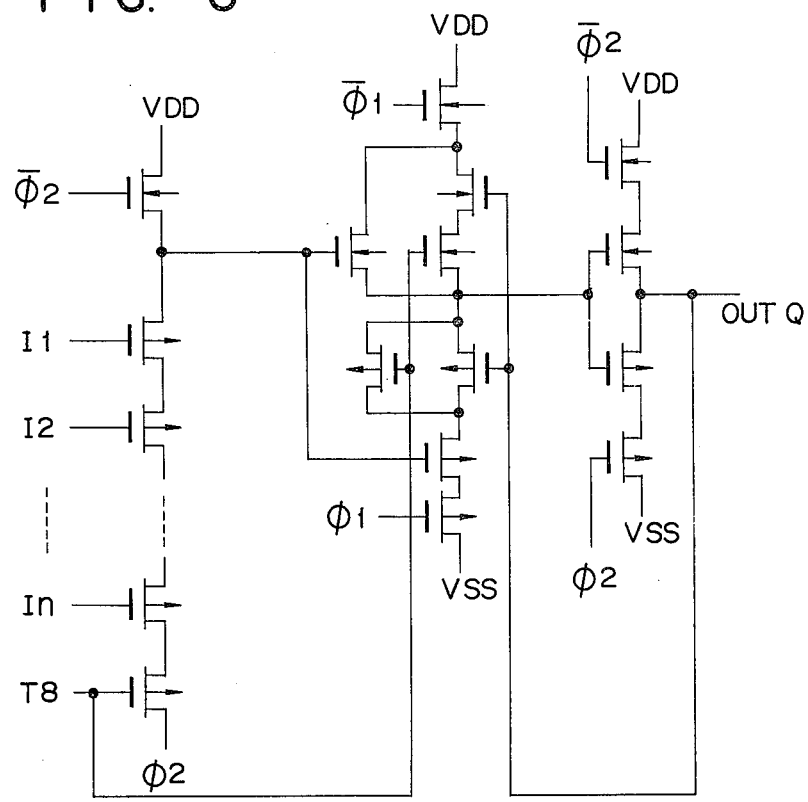
FIG. 6 shows a concrete example of one of the logical control circuits shown in FIG. 4.
Figure 7:
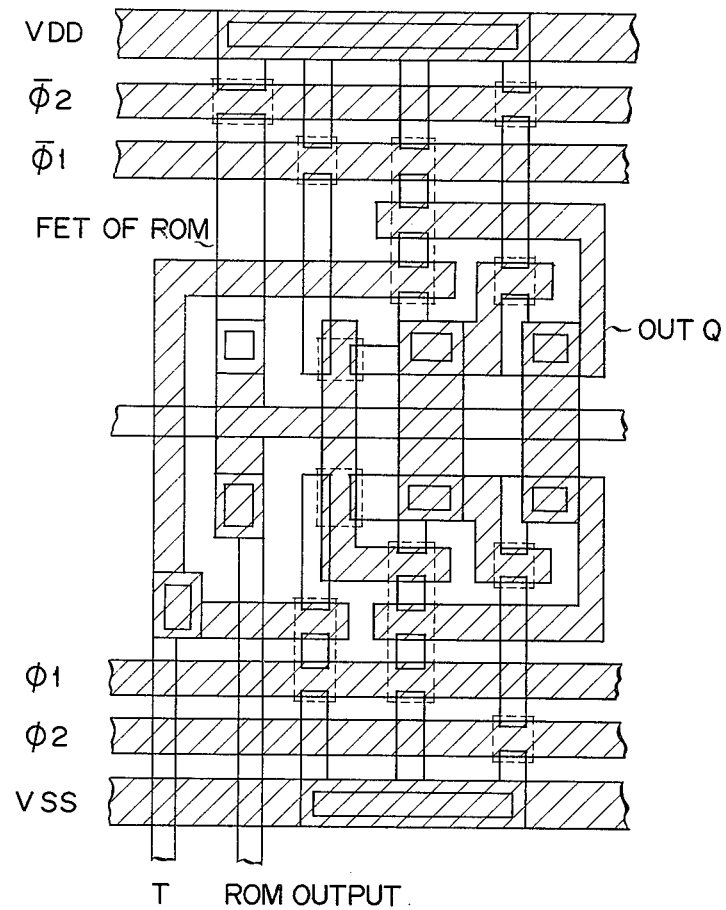
FIG. 7 shows an integrated pattern of the logical control circuits shown in FIG. 6.
Figure 8:
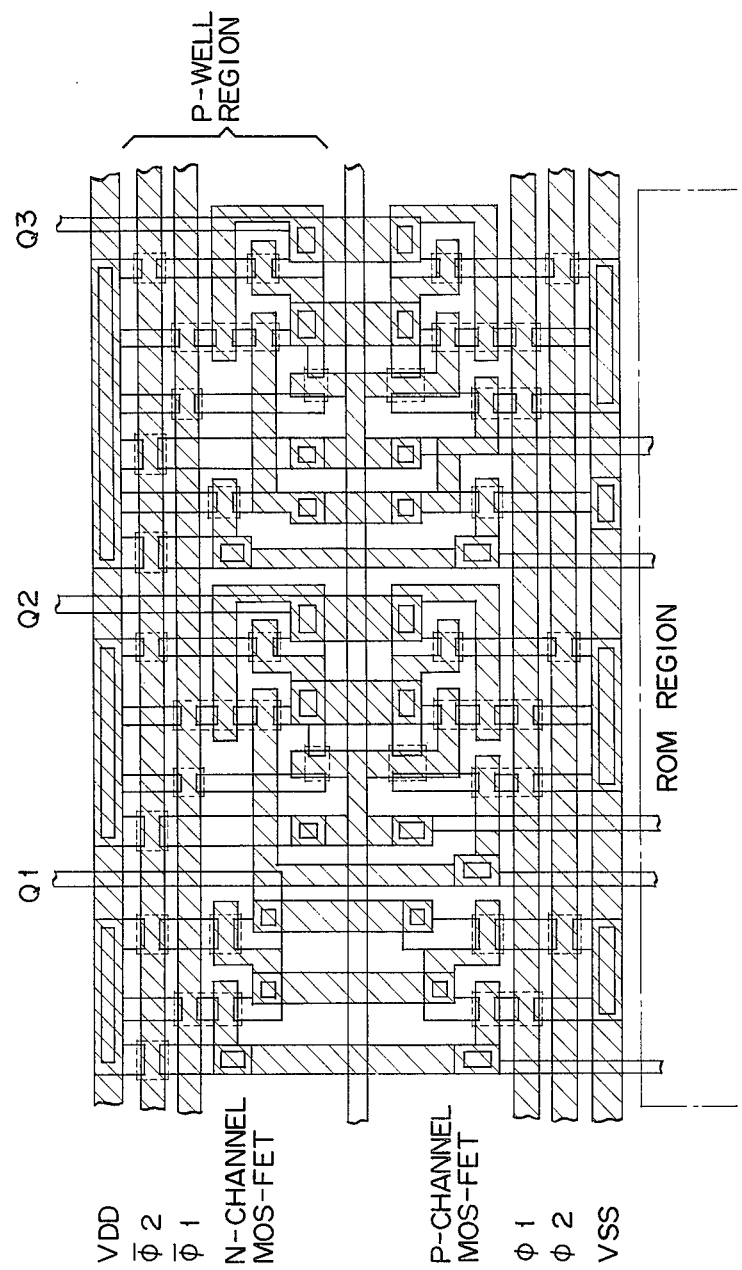
FIG. 8 shows an integrated pattern of the logical circuit unit shown in FIG. 4.

FIG. 6 shows a concrete circuit including the logical control circuit 12 of FIG. 4 and the logical gate G12 associated with circuit 13, this concrete circuit, however, being such a circuit as is supplied with the input signals I1 to In. When the logical control circuit section of the logical circuit of FIG. 6 (that is logical gate section is omitted) is integrated, it is constructed into such an integrated pattern as shown in FIG. 7. When the logical circuit apparatus of FIG. 4 is subjected to such patternization, it is constructed into such a pattern as shown in FIG. 8. From the pattern of FIG. 8, however, is omitted the logical control circuit 15 of FIG. 4.

Figure 1:
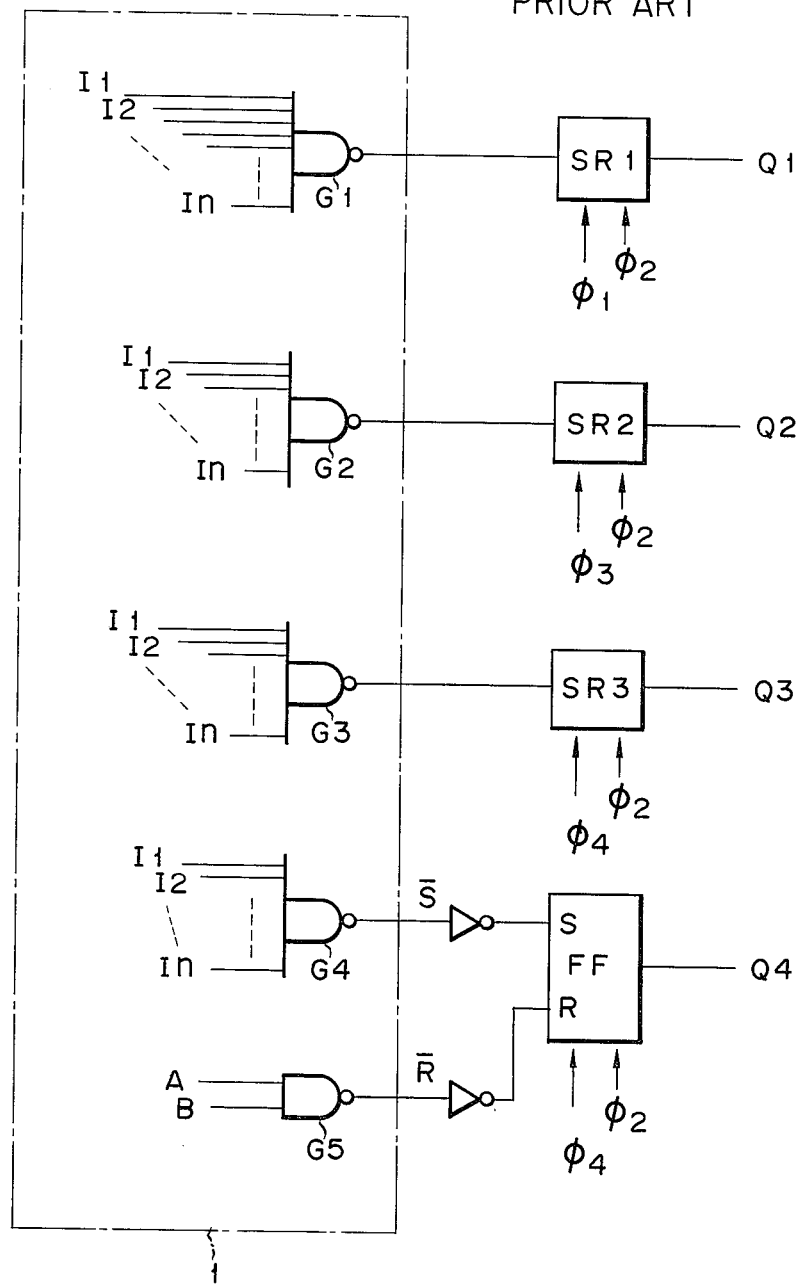
FIG. 1 shows the construction of a conventional logical circuit.
Figure 2A:
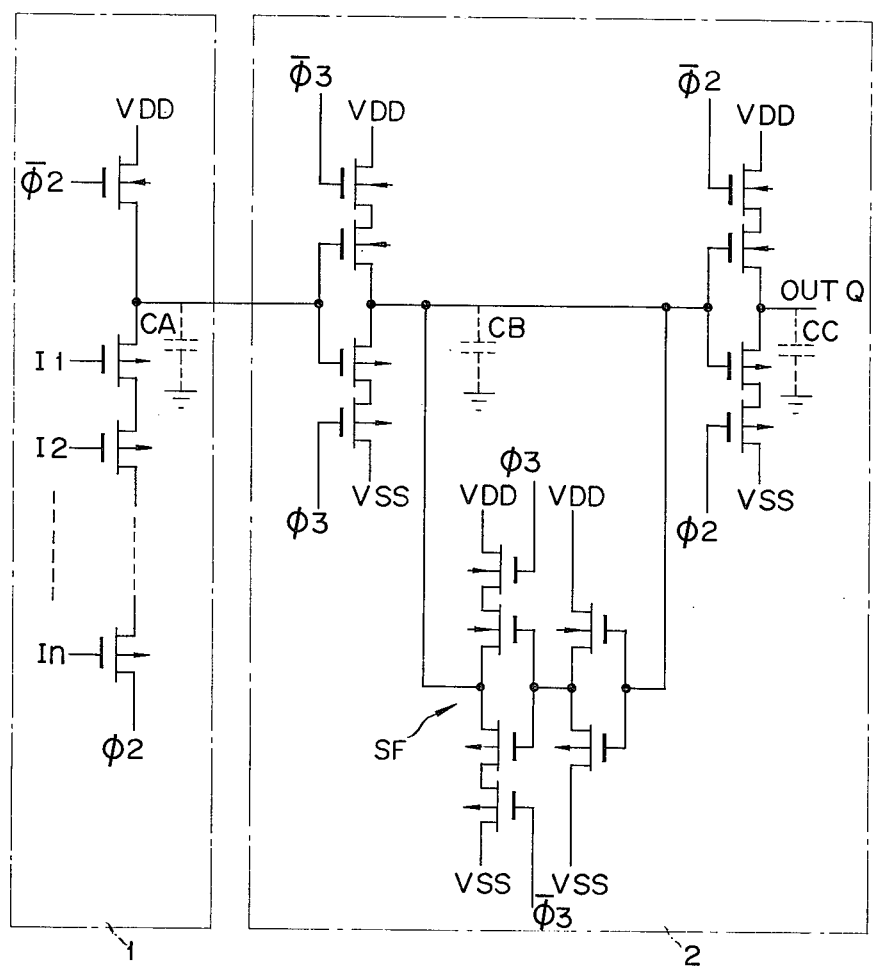
FIG. 2A shows a concrete example of the conventional logical circuit having a desired logical function, shown in FIG. 1.
Figure 2B:
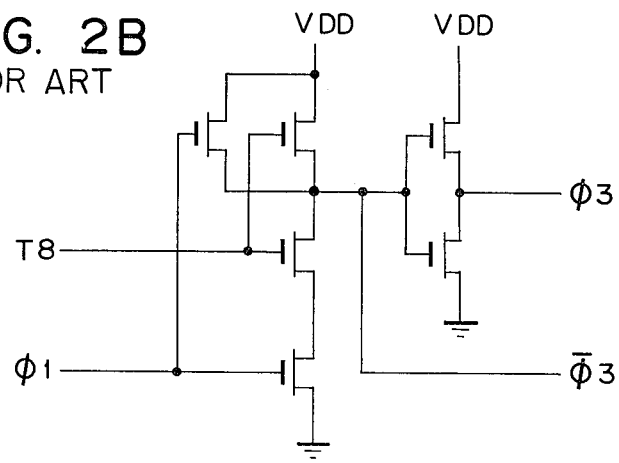
FIG. 2B shows a circuit for forming a clock pulse $\phi3$.
Figure 3:
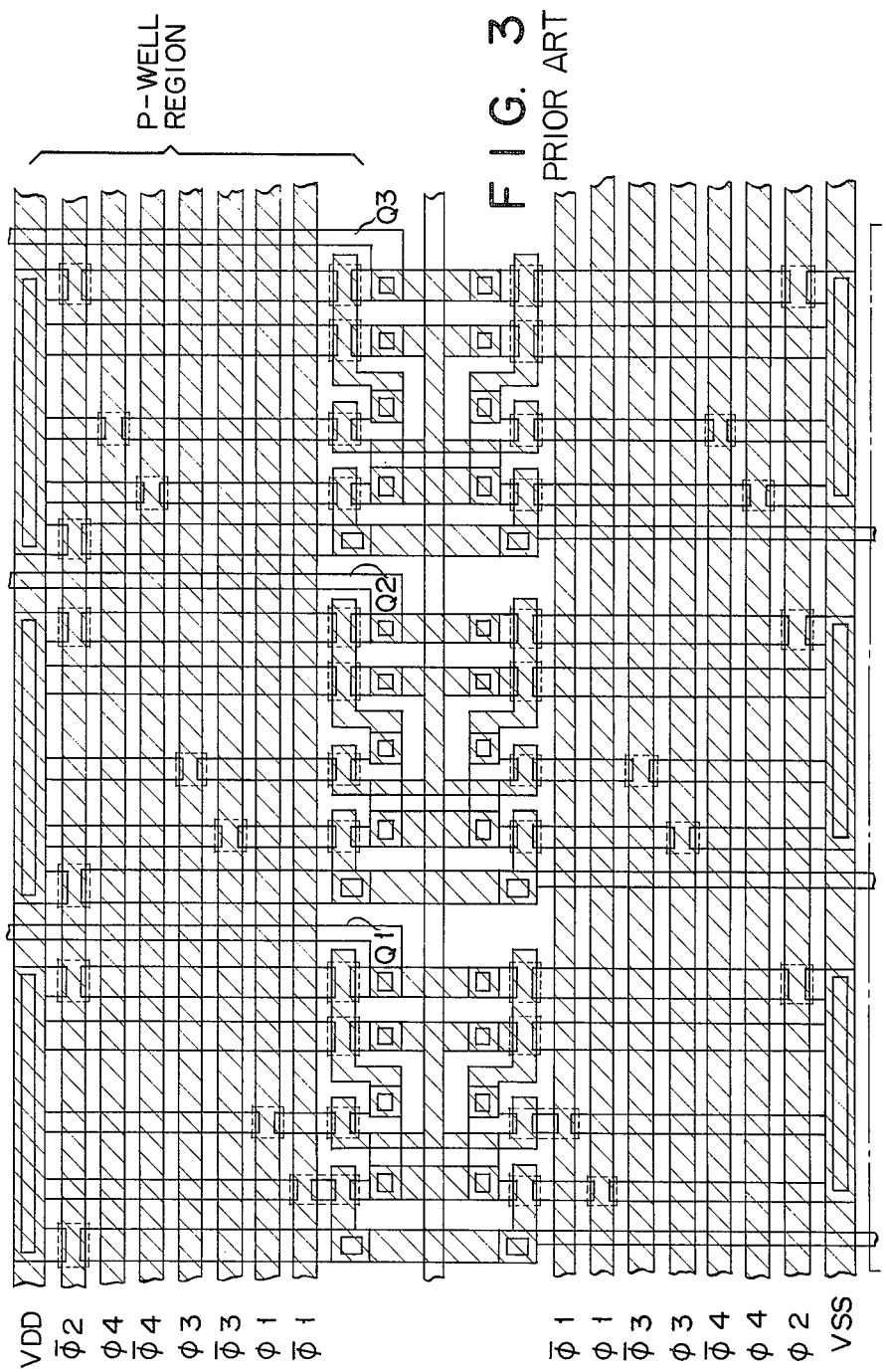
FIG. 3 shows an integrated pattern of the conventional logical circuit of FIG. 1.

As apparent from FIG. 8, only four clock pulse lines respectively corresponding to clock pulses $\phi 1$, $\phi 2$, $\overline{\phi 1}$ and $\overline{\phi 2}$ are required, so that the present integrated pattern is simplified to an appreciable extent as compared with the conventional pattern of FIG. 3. Further, this invention does not utilize, for example, the clock pulses $\phi 3$ and $\phi 4$ as in the prior art, so that no circuit for forming such clock pulses $\phi 3$ and $\phi 4$ is required to enable the circuit elements to be reduced in the number to a considerable extent.

Figure 9:
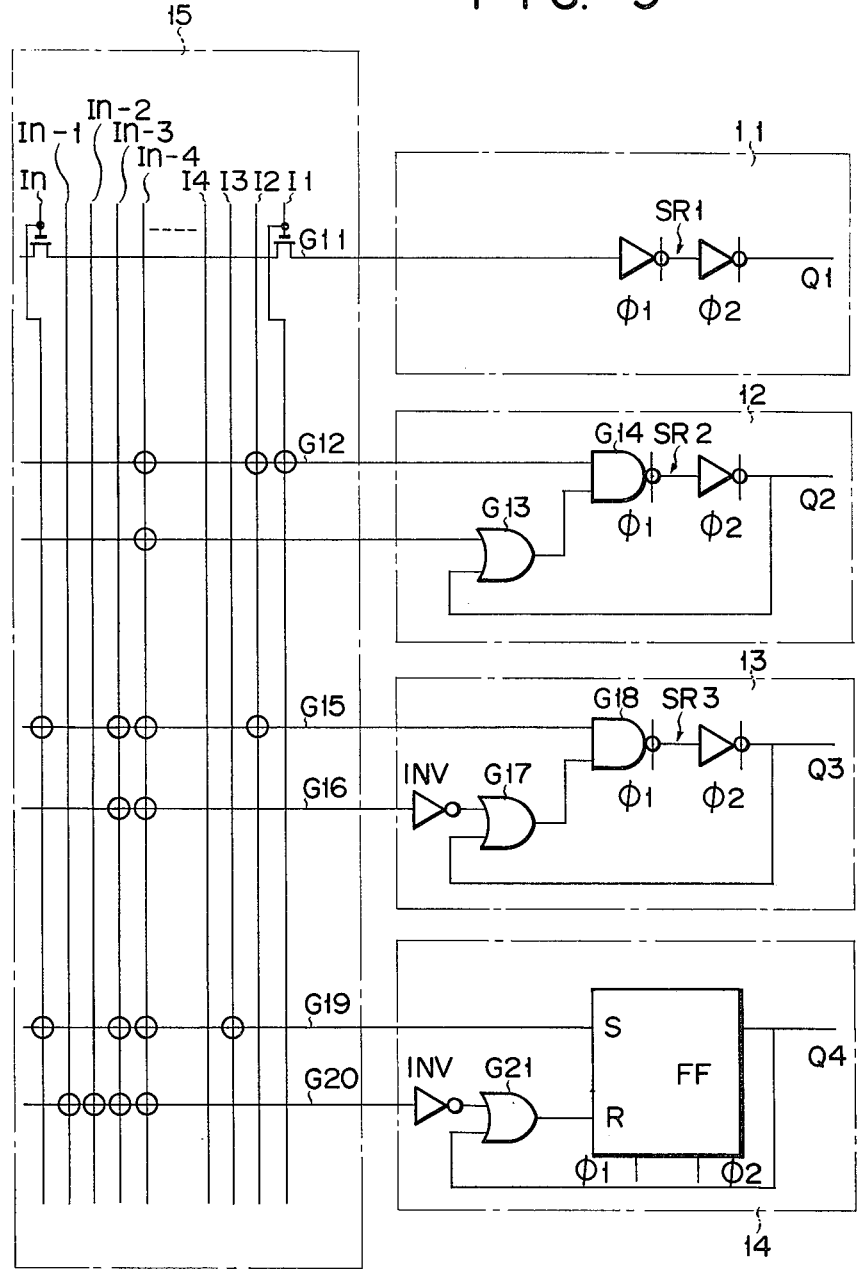
FIG. 9 shows a logical circuit apparatus according to another embodiment of the invention using as control pulse signals the signals selectively drawn out from the input signals.

Comparing the conventional pattern of FIG. 3 having the same circuit function with the present pattern of FIG. 8, it is apparent that a chip area occupied by the logical circuit apparatus, according to the invention, is made small. In this embodiment, the input signals A, B, T8 and D4 become necessary as inputs to a matrix Read Only Memory 15 constituted by a group of input logical gates G11, G12, G15, G16, G19 and G20. But, an increment in an area necessary to form a circuit for generating signals A, B, T8 and D4 is appreciably small as compared with a decrement in an area reduced due to no usage of the clock pulses $\phi 3$ and $\phi 4$, so that an area occupied by the pattern of the logical circuit apparatus is made appreciably smaller as previously mentioned. In addition, an area occupied by one bit in the Read Only Memory is by far I2 than an area occupied by the shift registers SR, and as stated in, for example, the literature "IEEE ISSCC Digest of Technical Paper, 1973, pages 58 to 59, wpm 6 : 3 Clocked CMOS Calculator Circuitry" this ratio is only about 1/100. Accordingly, even if control pulses being supplied to the ROM are increased in number, and resultant increase of a chip area will be almost negligible. In the clock synchronization systems used, for example, in an electronic desk-top calculator, clock apparatus, or automobile, the signals I1, I2, ... In from the ROM 15 necessarily include signals corresponding to the pulses A, B, T8 and D4, in accordance with the timing relationship between pulse signals generated in said systems, for example, frequently, In—4 = T8, and In—3 = D4. In these cases, any one input signal from the ROM 11 is not increased, as understood from FIG. 9.

As above described, this invention enables a group of delay circuits or storage circuits requiring a wide variety of driving clock pulses to be driven by a fewer kinds of clock pulses, thereby reducing an area occupied by the integrated pattern.

Figure 10:
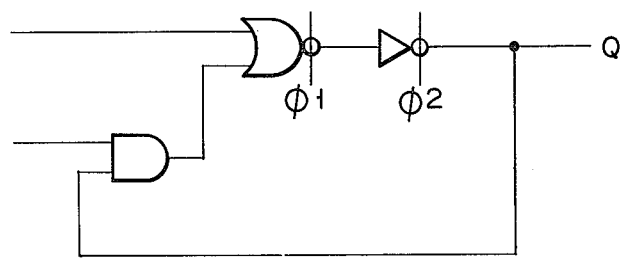
FIG. 10 shows the logical control gate circuit of a logical circuit unit according to another embodiment of the invention.

This invention is not limited to the complementary FET circuit but can be applied to, for example, a PMOS circuit. Further, a group of logical gates included in the ROM may be constituted by NAND, NOR or AND-OR gates. In the circuit shown in FIG. 4, the logical gates G13 and G14 included in, for example, the logical control circuit 12 comprise, as shown in FIG. 10, for example, the gate G13 which may be formed of an AND gate and the gate 14 which may be formed of an OR gate. Further, the circuit shown in, for example, FIG. 6 may be constructed by replacing the N channel type FET with the P channel type FET and vice versa, or may be constituted by single channel type FET's.

What is claimed is:

1. A logical circuit apparatus comprising a plurality of logical control circuits each having either a delay circuit or a storage circuit driven by a writing-in clock pulse $\phi 1$ and a reading-out clock pulse $\phi 2$ supplied thereto; a logical gate circuit supplied with a signal group including a plurality of input signals and a plurality of control pulse signals each having a frequency different from that of said clock pulses $\phi 1$ and $\phi 2$ and constituted by a plurality of main logical gates each supplied with at least one input signal of said signal group and connected correspondingly to each of said logical control circuits and a plurality of auxiliary logical gates each supplied with at least one of said control pulse signals; and a plurality of logical control gate circuits respectively included in prescribed ones of said logical control circuits and connected correspondingly to each of said auxiliary logical gates, for making a logical control of an output from the corresponding logical gates in accordance with an output from a corresponding one of said auxiliary logical gates and a feedback signal from said logical control circuit.

2. A logical circuit apparatus according to claim 1 wherein at least one of said logical control gate circuits is constituted by an OR gate supplied with an output from said auxiliary logical gate and a feedback signal from said logical circuit and an AND gate supplied with an output from said OR gate and an output from said logical gate circuit to supply its output to said either one of the delay circuit and the storage circuit.

3. A logical circuit apparatus according to claim 1 wherein at least one of said logical control gate circuits is constituted by an AND gate supplied with an output from said auxiliary logical gate and a feedback signal from said logical circuit and an OR gate supplied with an output from said AND gate and an output from said logical gate circuit to supply its output to said either one of the delay circuit and the storage circuit.

4. A logical circuit apparatus according to claim 1 wherein said logical gate circuit is constituted by a Read Only Memory constituted by MOS transistors having a prescribed channel type in the form of a matrix.

5. A logical circuit apparatus according to claim 4 wherein said logical control circuit is constituted by MOS transistors having a channel type different from that of MOS transistors constituting said logical gate circuit.

6. A logical circuit apparatus according to claim 1 wherein the main and auxiliary logical gates included in said logical gate circuit are constituted by NAND gates.

7. A logical circuit apparatus comprising a plurality of logical control circuits each having either a delay circuit or a storage circuit driven by a writing-in clock pulse $\phi 1$ and a reading-out clock pulse $\phi 2$ supplied thereto, a logical gate circuit supplied with a plurality of input signals and constituted by a plurality of main logical gates each supplied with at least one of said input signals and a plurality of auxiliary logical gates each supplied with at least prescribed one of said input signals which contain a frequency component different from that of said clock pulses $\phi 1$ and $\phi 2$, and a plurality of logical control gate circuits respectively included in prescribed ones of said logical control circuits and connected correspondingly to each of said auxiliary logical gates, for making a logical control of an output from the corresponding logical gate in accordance with an output from a corresponding one of said auxiliary logical gates and a feedback signal from said logical control circuit.

* * * * *